United States Patent [19]
Buck

[11] 3,932,803
[45] Jan. 13, 1976

[54] ELECTRONIC MONITORING SYSTEM INCLUDING CONTACTLESS MOTION DETECTOR

[76] Inventor: Robert Buck, Kirchbuhlweg 128, 7995 Neukirch, Germany

[22] Filed: June 12, 1974

[21] Appl. No.: 478,682

[30] Foreign Application Priority Data
June 14, 1973 Germany............................ 2330233

[52] U.S. Cl............. 323/19; 307/252 A; 307/252 P; 317/DIG. 2; 323/1; 323/22 Z; 328/5; 340/258 B
[51] Int. Cl.².................................. H01H 36/00
[58] Field of Search......... 307/252 A, 252 J, 252 P; 317/148.5 B, DIG. 2; 323/1, 4, 19, 22 R, 22 Z; 328/5; 331/65, 109; 340/258 R, 258 B, 258 C, 282

[56] References Cited
UNITED STATES PATENTS

| | | |
|---|---|---|
| 3,114,872 | 12/1963 | Allard .................................... 323/4 |
| 3,303,413 | 2/1967 | Warner et al........................... 323/4 |
| 3,508,084 | 4/1970 | Warner .................................. 323/22 R |
| 3,747,012 | 7/1973 | Buck....................................... 328/5 X |
| 3,777,251 | 12/1973 | Cecil et al.............................. 323/4 |

*Primary Examiner*—A. D. Pellinen
*Attorney, Agent, or Firm*—Karl F. Ross; Herbert Dubno

[57] ABSTRACT

A contactless motion detector, including an oscillator and an amplifier, has an energizing circuit connected across an electronic breakdown device lying in series with a contant-current unit, this series combination receiving pulsating direct current from a supply circuit in parallel with an output thyristor which bridges either the entire series combination or only the constant-current unit. The output thyristor is controlled by a switching transistor responding to an output signal from the motion detector; even when the output thyristor fires to actuate a load in the supply circuit, a sufficient voltage drop is maintained across the breakdown device to keep the oscillator and the amplifier operating.

25 Claims, 8 Drawing Figures

ELECTRONIC MONITORING SYSTEM INCLUDING CONTACTLESS MOTION DETECTOR

CROSS-REFERENCE TO RELATED APPLICATION

This application contains subject matter disclosed in my copending application Ser. No. 325,953 filed Jan. 22, 1973.

Field of the Invention

My present invention relates to an electronic monitoring system, e.g. as used in a proximity sensor, incorporating a preferably contactless detector sensitive to an ambient condition for generating an output signal which varies with a change in that condition, e.g. with the approach of a metallic element.

Background of the Invention

In my copending application identified above, as well as in my prior U.S. Pat. Nos. 3,747,010, 3,747,011 and 3,747,012, I have disclosed a system of this type wherein a contactless motion detector includes an oscillator and an amplifier connected to a load via a two-wire circuit which serves both for the actuation of that load and for the energization of the oscillator and the amplifier. An output thyristor, triggerable by a detector-controlled switching transistor, is connected across all or part of a voltage-generating network that includes an electronic breakdown device, specifically a Zener diode, in series with a high-ohmic resistor which is short-circuited upon the firing of the thyristor (either in the absence or in the presence of the object whose approach is to be monitored), the voltage drop across the Zener diode insuring the availability of a sufficient operating voltage for the detector in either state of conductivity of the thyristor. My copending application also teaches the inclusion in the voltage-generating network of a storage capacitor connected in parallel with the breakdown device and separated therefrom by a decoupling diode, this capacitor serving to smooth the ripples of the raw-rectified supply voltage which insures prompt cutoff of the thyristor upon de-energization of its gate.

Objects of the Invention

The general object of my present invention is to provide an improved electronic monitoring system of the class referred to in which the operating voltage for the detector, derived from the aforementioned voltage-generating network, is substantially stable even in the presence of widely varying supply voltages ranging, for example, between 40 and 250V.

Another object is to provide means in such a system for reducing the power consumption of the voltage-generating network and, consequently, the amount of resulting waste heat.

Summary of the Invention

I realize these objects, pursuant to my present invention, by replacing the high-ohmic resistor of the voltage-generating network of my copending application and prior patents with a constant-current unit in series with the associated electronic breakdown device. The constant-current unit maintains the necessary voltage drop across the breakdown device under all operating conditions, i.e. regardless of changes in the conductivity of the output thyristor or of some other variable-impedance means in its place, even if the pulsating supply voltage is very high. Naturally, such a unit maintains the substantial constancy of its current only if the supply voltage is sufficient to drive that current through the circuit elements in series therewith, specifically through the electronic breakdown device in the present instance; for supply voltages above this minimum level, the unit acts as a current limiter.

Such a current-limiting unit may comprise an output transistor with a biasing circuit for its base connected across its collector and emitter, this biasing current forming a voltage divider with a resistive first branch lying between collector and base and with at least partly semiconductive second branch inserted between base and emitter. In a simple case, this second branch consists essentially of a Zener diode. For greater current stability, this second branch may comprise an ancillary transistor whose input circuit includes an emitter resistor of the output transistor and whose conductivity is thereby controlled to compensate for changes in current flow through that emitter resistor. This compensatory action can be intensified, according to a further feature of my invention, with the aid of a transistorized shunt circuit having an input connection to a tap on the voltage divider of the biasing circuit and an output connection to the emitter of the output transistor, advantageously with interposition of a threshold-responsive diode inserted in the forward direction between the emitter of the output transistor and the associated emitter resistor.

In a particularly useseful embodiment of such a constant-current unit, facilitating its realization by integrated circuitry even with high power requirements, the transistorized shunt circuit comprises two complementary transistors (PNP and NPN) connected in tandem with each other.

As disclosed in my copending application Ser. No. 325,953, the switching transistor responsive to the output signal of the detector may have its collector connected either to a gate lead or to a cathode lead of the output thyristor. In the latter instance, as likewise disclosed in that copending application, a supplemental bias may be imparted to the thyristor gate by connecting the gate lead to that collector through an inverter stage.

The breakdown device need not be a simple Zener diode but may comprise, instead, an ancillary thyristor with a nonlinear passive impedance (which may be a Zener diode) connected between its gate and anode, as known per se from my German published patent specification No. 2,127,956. Since the voltage drop across such an ancillary thyristor in its conductive state is considerably less than that across a conducting Zener diode in the same position, the energy dissipation in such a modified breakdown device during conduction of the principal or output thyristor (or of an equivalent electronic binary switch) is significantly reduced.

It should be noted, however, that the basic principles of my invention are not limited to a system in which the constant-current unit (or, possibly, the entire voltage-generating network including that unit) is shunted by a binary electronic switch such as a thryistor or a triac; on the contrary, that switch should also be replaced by a variable-impedance device (e.g. a transistor) responsive to an analog signal, with a conductivity changing gradually over a predetermined range. Instead of an oscillator, therefore, the detector may include other sensing means such as a magnetic diode, a field plate, a photoresistor, a photodiode, a phototransistor, a resistive or reactive bridge circuit, or the like.

BRIEF DESCRIPTION OF THE DRAWING

The above and other features of my present invention will now be described in detail with reference to the accompanying drawing in which.

SPECIFIC DESCRIPTION

Figure 1:
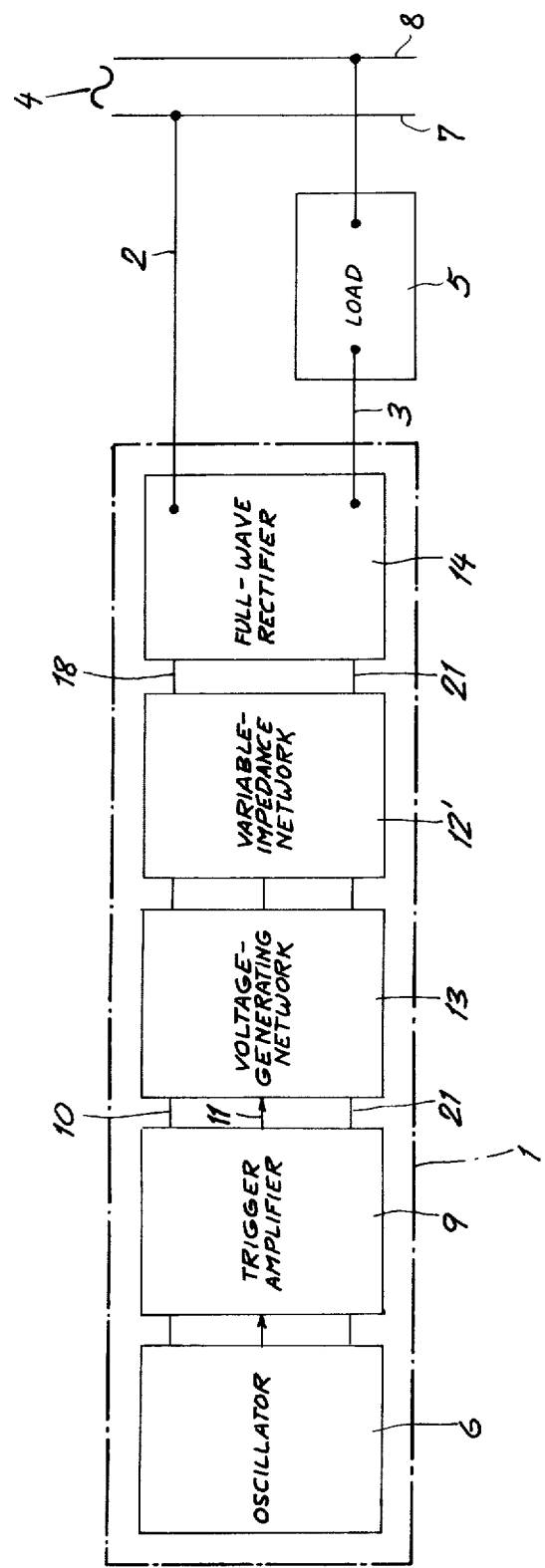
FIG. 1 is a block diagram of an electronic monitoring system embodying my invention.

FIG. 1 shows the basic components of a monitoring system according to my invention, namely an oscillator 6 and a trigger amplifier 9 together constituting a detector, a current-responsive load 5 such as a relay in a supply circuit whose two conductors 2, 3 are connected via respective bus bars 7, 8 across an a-c source 4, a full-wave length rectifier 14 inserted between the supply conductors 2, 3 and a pair of leads 18, 21 extending to a variable-impedance network 12' whose impedance controls the load current in response to signals from oscillator 6, and a voltage-generating network 13 also receiving the output of rectifier 14 by way of leads 18 and 21. Network 13 is connected to amplifier 9 by leads 10, 11 and 21 which serve on the one hand to control a switching transistor 20 (FIG. 2) within that network and on the other hand to supply the detector stages 6 and 9 with operating voltage. Components 6, 9, 12', 13 and 14 form part of a proximity sensor 1 of the general type described in prior U.S. Pat. Nos. 3,747,010, 3,747,011 and 3,747,012.

Figure 2:
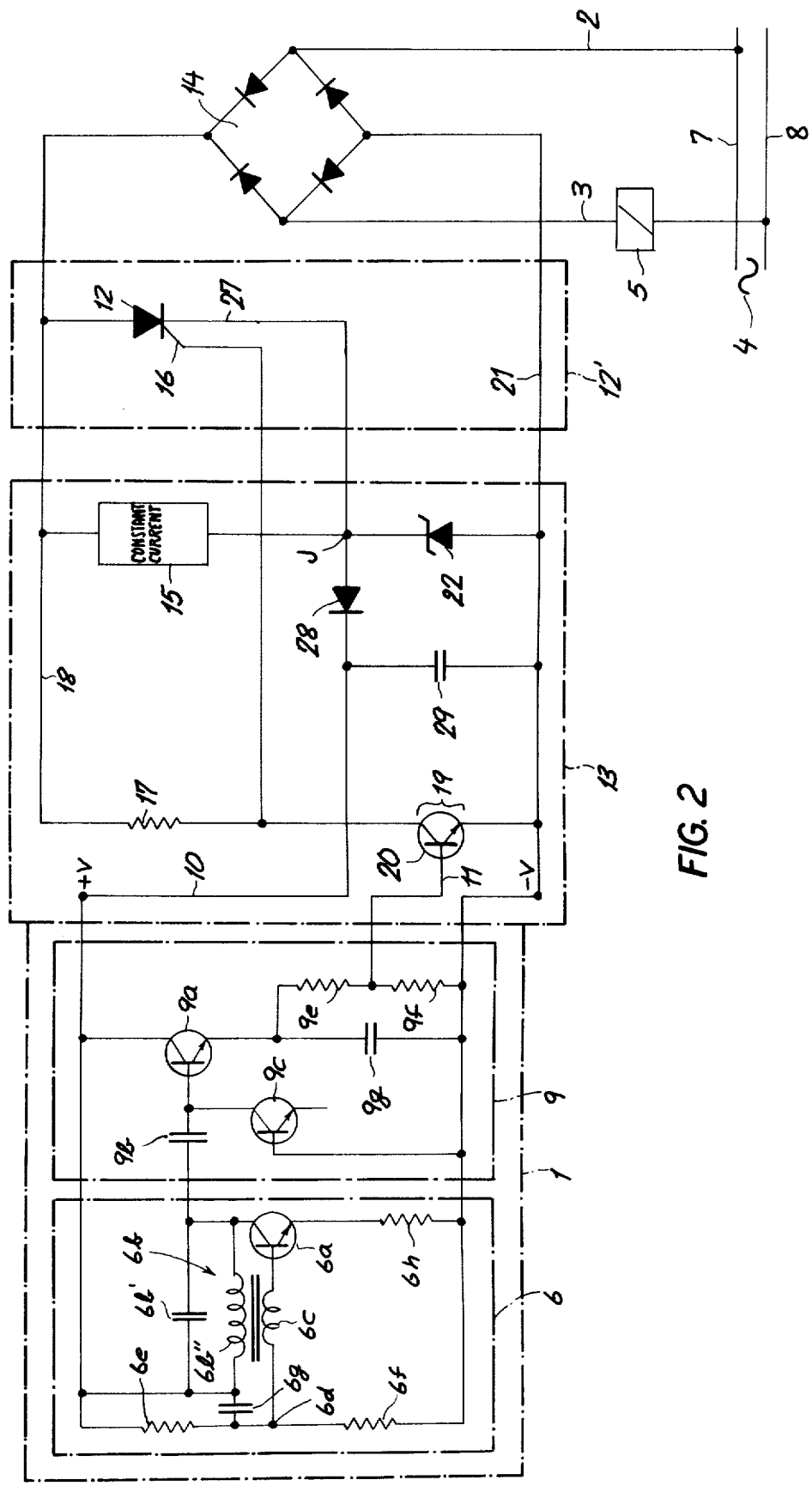
FIG. 2 is an overall circuit diagram of a proximity sensor similar to that shown in my copending application Ser. No. 325,953 but illustrating the present improvement.

As shown in FIG. 2, the oscillator 6 comprises an NPN transistor 6a whose collector circuit includes a parallel-resonant network 6b consisting of a capacitor 6b' and an inductor 6b''. A feedback inductor 6c is connected between the base of the transistor 6a and a common terminal 6d of a pair of resistances 6e, 6f forming a voltage-divider network; the two coils 6b'', 6c are inductively coupled as diagrammatically indicated in the drawing. Resistance 6e is bridged by a shunt capacitor 6g. A resistance 6h is connected between the emitter of transistor 6a and a negative bus bar 21 also tied to the resistance 6f. This oscillator generates an output of a frequency determined by the tank circuit 6b and at a level depending, in a manner known per se, on the damping induced by the proximity of metal parts to the oscillator (specifically to its tank circuit 6b) which lowers the Q of circuit 6b and therefore reduces the effective collector resistance of transistor 6a along with the amplification factor K so as to attenuate the oscillator output.

Component 9 is an amplification stage triggerable by the output of the oscillator 6 when the loop gain KV of the amplifier 6a thereof makes the transition between values greater and less than unity. The trigger stage 9 comprises a transistor 9a of the NPN type whose base is tied to the collector of transistor 6a by a d.c.-blocking coupling capacitor 9b. The base of transistor 9a is biased positively by a transistor 9c connected as a diode to the negative bus bar 21 of the circuit. The output of transistor 9a, whose amplitude decreases upon the approach of a metallic element as described above, is applied by an emitter impedance, in the form of an R/C network consisting of resistors 9e and 9f bridged by a storage capacitor 9g, via lead 11 to the base of the aforementioned switching transistor 20 included in the voltage-generating network 13. Transistor 20 has its emitter tied to negative bus bar 21 and has its collector connected through a resistor 17 to the positive bus bar 18 energized by rectifier bridge 14 with raw-rectified voltage; this collector, in the embodiment of FIG. 2, is further connected to a gate lead 16 of an output thyristor 12 forming part of the variable-impedance network 12'. This output thyristor, whose anode is connected to positive bus bar 18, further has a cathode lead 27 connected through a decoupling diode 28 to the lead 10 which extends to the positive power-input terminal +V of detector 6, 9 whose negative power-input terminal −V is tied to bus bar 21. A storage capacitor 29, serving to smooth the pulsating half-cycles of the raw-rectified voltage from bridge 14, is connected across conductors 10 and 21 in parallel with the series combination of rectifying diode 28 and a Zener diode 22; the junction J of these two diodes is connected through a constant-current unit 15 to positive bus bar 18 which is thus shunted by the anode/cathode path of thyristor 12.

As long as oscillator 6 operates normally, which in this instance may be the case whenever there is no extraneous metallic element in its vicinity, switching transistor 20 conducts so that its collector/emitter resistance 19 is small compared with the resistance of Zener diode 22 in its conductive state. Gate lead 16 is then negatively biased with reference to cathode lead 27 so that thyristor 12 is cut off. Only a relatively small current, limited by the internal circuitry of unit 15, is then drawn through rectifier bridge 14 and relay 5 which controls a nonillustrated position indicator for the monitored element. When that element comes close to the detector oscillator 6, the latter is deactivated and cuts off the transistor 20 whereby gate lead 16 is driven positive with reference to cathode lead 27, causing thyristor 12 to fire. The additional current now drawn through bridge 14 and load circuit 2, 3 actuates the relay 5 to indicate the approach of the monitored element. The voltage drop across Zener diode 22, however, is not materially affected by this change in conductivity of binary switch 12.

Figure 3:
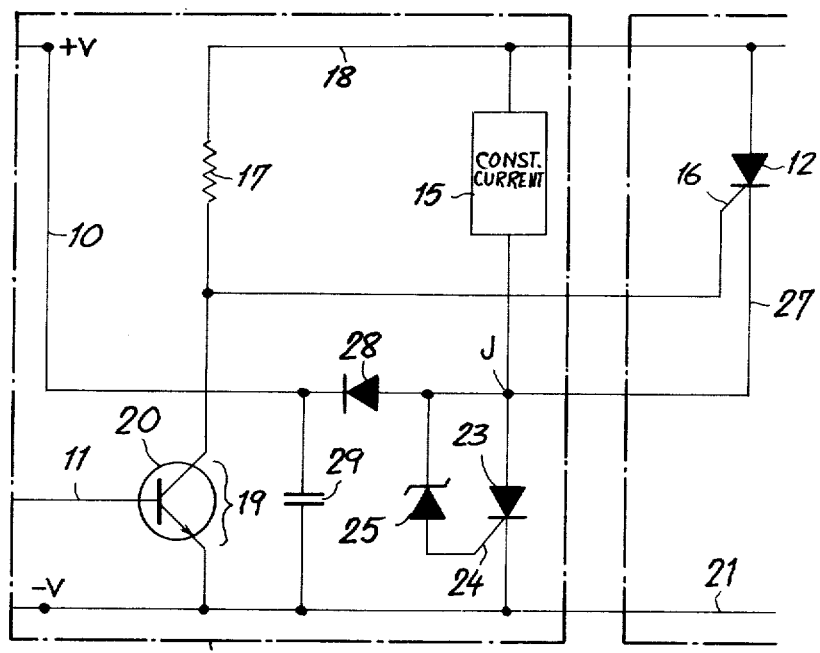
FIGS. 3, 4, 5 and 6 are circuit diagrams of different modifications of a voltage-generating network included in the system of FIG. 2.

FIG. 3 shows a modified network 13a which differs from the network 13 of FIG. 2 by the replacement of Zener diode 22 with an ancillary thyristor 23 having a nonlinear passive impedance 25, here a Zener diode, connected between its gate 24 and its anode which is tied to junction J and therefore to the cathode lead 27 of the thyristor 12. In this instance the Zener diode 25 draws current only during a brief instant in each half-cycle, i.e. until the previously quenched thyristor 23 conducts; thus, for the greater part of the cycle, the Zener breakdown voltage of about 5 or 6 V present at junction J (with reference to bus bar 21) in the system of FIG. 2 is replaced by the substantially lower voltage drop developed across the conducting thyristor 23. The presence of decoupling diode 28 between junction J and capacitor 29 insures in both instances the periodic cutoff of breakdown device 22 or 23, 25.

Figure 4:
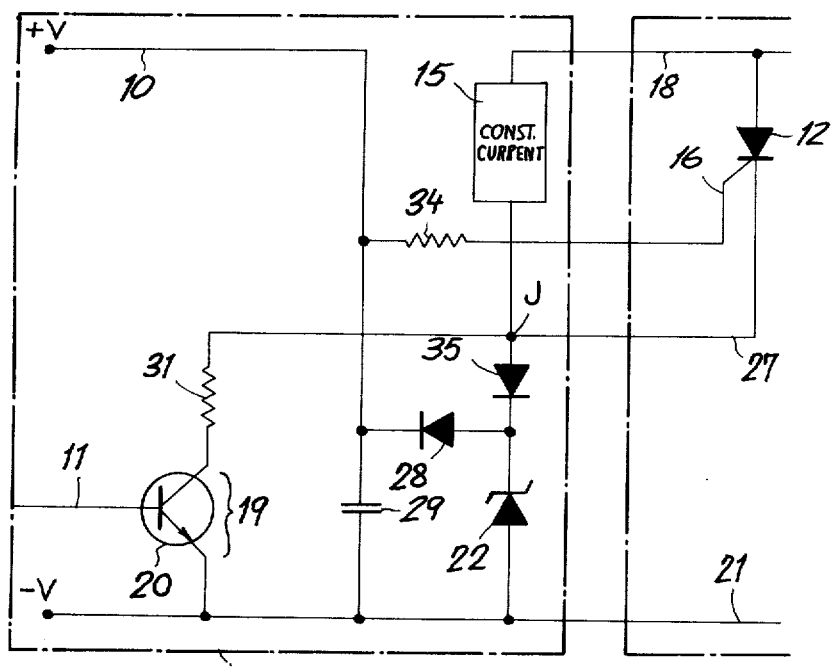

FIG. 4 shows a network 13b, generally similar to network 13 of FIG. 2, wherein the switching transistor 20 has its collector connected through a resistor 31 to junction J and thus to the lead 27 extending from the cathode of thyristor 12. Gate lead 16 is here connected through a resistor 34 to the positive supply conductor 10 for the detector 6, 9 and therefore also to junction J by way of decoupling diode 28 in cascade with a further diode 35, the latter diode lying between junction J and Zener 22.

In this instance, thyristor 12 fires whenever transistor 20 conducts so that its collector/emitter resistance 19 becomes negligible. With transistor 20 cut off, cathode lead 27 is more positive than gate 16 by the voltage drop across diodes 28 and 35 due to the operating current of the detector 6, 9 (FIGS. 1 and 2). If transistor 20 conducts when the ocillator 6 of the detector is deactivated, this oscillator may draw sufficient current through lead 10 in the nonconductive state of transistor 20 to obviate the need for a second diode 35 in cascade with diode 28.

Figure 5:
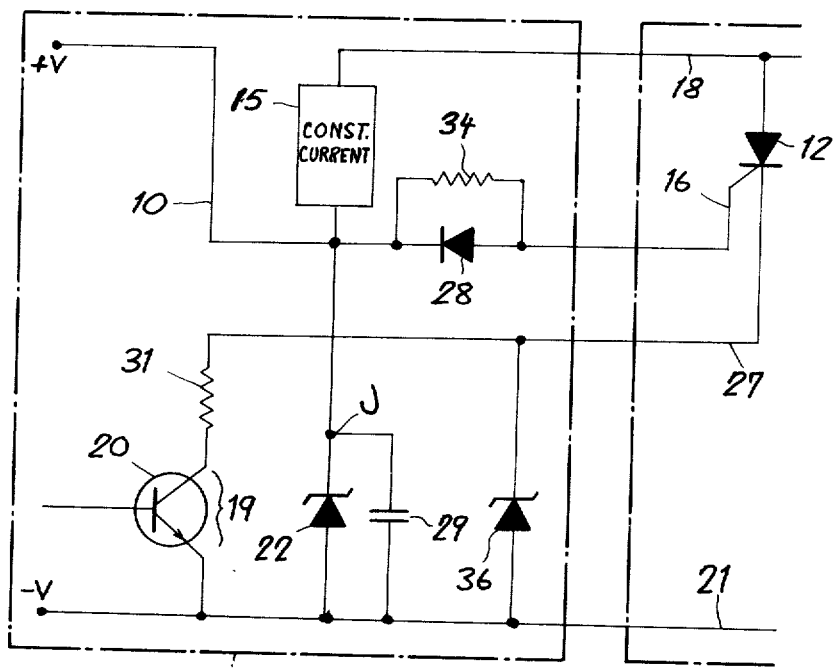

In FIG. 5 I have shown another modified network 13c in which the junction J between constant-current unit 15 and Zener diode 22 as well as storage capacitor 29 is no longer tied to the cathode lead 27 of thyristor 12, wherefore the decoupling diode 28 has been relocated to lie in parallel with gate resistor 34 between leads 16 and 10. Lead 27 is here connected to bus bar 21 through another Zener diode 36 in parallel with the series combination of resistor 31 and collector/emitter resistance 19 of switching transistor 20. The breakdown voltage of Zener 36 must in this case be not less than that of Zener 22 in order to prevent an untimely firing of thyristor 12.

Figure 6:
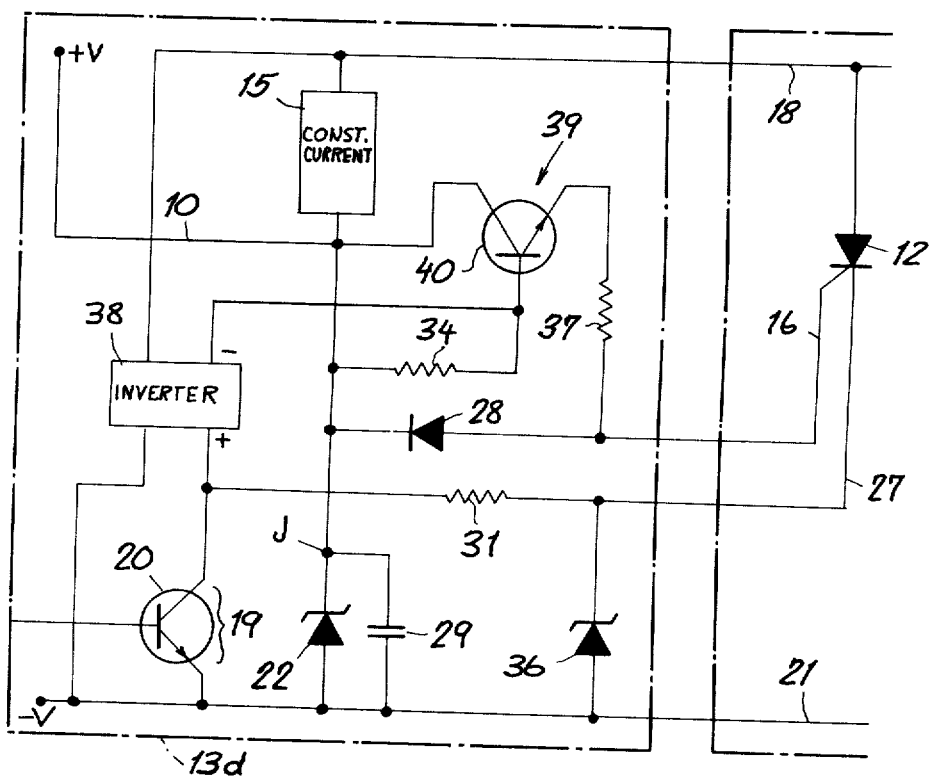

In FIG. 6 I have shown at 13d a modification of the network of FIG. 5 in which the relationship between the breakdown voltages of Zener diodes 22 and 36 is no longer critical. For this purpose the gate of thyristor 12 is provided with a biasing circuit 39 including an inverter stage 38 inserted between the collector of transistor 20 and the base of emitter-follower ancillary NPN transistor 40 whose collector is connected to lead 10 and junction J and whose emitter is tied to lead 16 through a resisitor 37. The base of transistor 40 is also connected through resistor 34 to junction J. Thus, when cathode lead 27 is driven positive in the nonconductive state of switching transistor 20, the base of transistor 40 goes negative along with junction J and gate lead 16. The presence of emitter-follower transistor 40 enables effective control of the voltage swing on lead 16 even with a high-ohmic gate resistor 34 which in turn allows the constant-current unit 15 to be adjusted for a relatively low output current.

Figure 7:
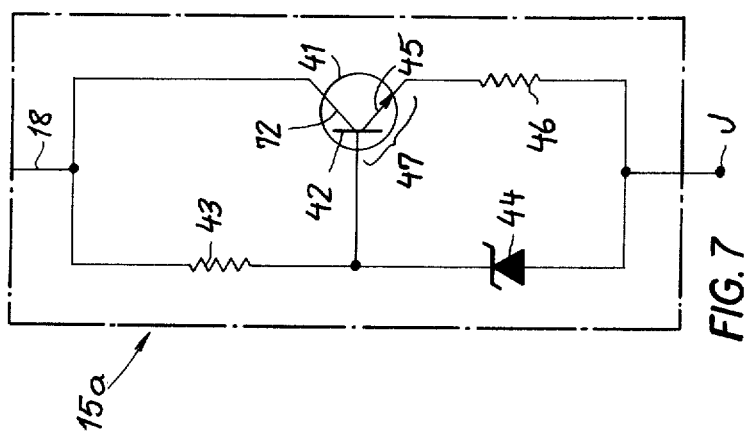
FIG. 7 is a circuit diagram of a simple constant-current unit adapted to be used in any of the voltage-generating networks of FIGS. 2 – 6.

Reference will now be made to FIG. 7 where I have shown at 15a a possible circuit for the constant-current unit designated 15 in the preceding Figures. This circuit includes an output transistor 41 of NPN type having its collector 72 tied to positive bus bar 18 and having its emitter 45 connected to junction J through a resistor 46, transistor 41 and resistor 46 being shunted by a voltage divider comprising a resistor 43 in series with a Zener diode 44. The base of transistor 41 is connected to the junction of impedance elements 43 and 44, the potential of this junction being held constant with reference to junction J by the Zener 44. Since the voltage drop across the base/emitter path 47 of transistor 41 is also substantially constant, the current flowing through transistor 41 is essentially stable as long as the voltage on lead 18 is high enough (e.g. upward of 40V) to saturate that transistor. However, a parasitic current flow through voltage divider 43, 44 is not independent of the supply voltage so that the total throughput of unit 15a varies somewhat with voltage. The magnitude of this parasitic current can be reduced by choosing a sufficiently high resistor 43, yet this requires a high gain for transistor 41 which is difficult to realize where this transistor is to tolerate supply voltages up to, say, 250V.

Figure 8:
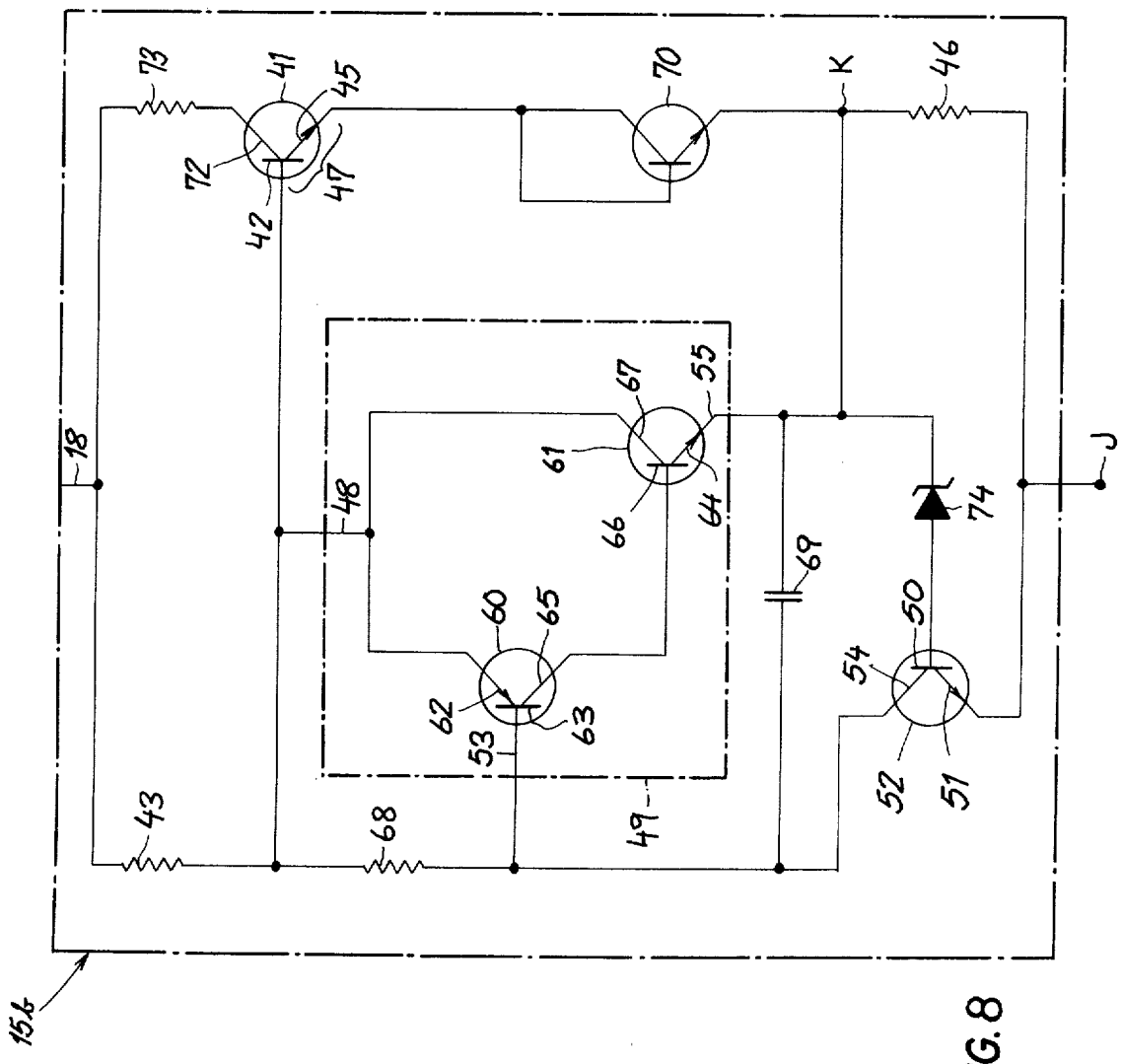
FIG. 8 is a circuit diagram of a more elaborate constant-current unit adapted to be substituted in any of these networks for the unit of FIG. 7.

In FIG. 8 I have shown an improved constant-current unit 15b which avoids this drawback. Here the emitter resistor 46 of transistor 41 is connected across the base 50 and the emitter 51 of an ancillary transistor 52 replacing the Zener diode 44 of the voltage divider of FIG. 7; the collector 54 of transistor 52 is connected to resistor 43 through another resistor 68. Furthermore, a transistorized shunt circuit 49 is connected across part of the voltage divider 43, 68, 52, this shunt circuit including a supply connection 48 tied to the base lead of transistor 41, an input connection 53 extending from the collector 54 of transistor 52, and an output connection 55 extending to a junction K on the emitter side of the resistor 46 and through a Zener diode 74 to the base of transistor 52; Zener 74, which provides a threshold for the energization of base 50, makes the dimensioning of emitter resistor 46 less critical but may be omitted in some instances. A damping capacitor 69 bridges the collector 54 and base 50 of transistor 52. Transistor 41 is provided with a protective collector resistor 73 and has its emitter 45 connected to resistor 46 through a threshold-responsive diode 70 represented by an NPN transistor having its base returned to its collector.

Shunt circuit 49 comprises two complementary transistors in tandem, namely an PNP transistor 60 and an NPN transistor 61. Transistor 60 has an emitter 62 tied to lead 48, a base 63 tied to lead 53 and a collector 65 tied to the base 66 of transistor 61 whose collector 67 is joined to lead 48 and whose emitter 64 is joined to lead 55.

The magnitude of emitter resistor 46 is so chosen that the voltage drop there across is just insufficient to initiate conduction to transistor 52 when the current through transistor 41 is of the desired value. When the supply voltage on lead 18 begins to rise, this voltage drop increases and, after breaking down the Zener 74, turns on the transistor 52 so as to drive negative the potential on the base lead 53 of transistor 60, thereby causing shunt circuit 49 to conduit. This conduction lowers the base potential of transistor 41 whose conductivity is therefore diminished, the resulting reduction in the current flow through this transistor being partly compensated by the additional current from shunt circuit 49 now traversing the resistor 43. Thus, the gains of the several transistors can be so chosen that a highly sensitive control of the output current is achieved. Threshold device 70 insures that the voltage drop between base 42 and junction K is always greater than that between this junction and lead 48, thereby enabling the transistor 60 and 61 to saturate in a condition of virtual cutoff of transistor 41.

Damping capacitor 69 serves to suppress transients occurring during switchover.

I claim:

1. An electronic monitoring system comprising:

detector means sensitive to an ambient condition for generating an output signal varying with a change in said condition, said detector means being provided with a pair of power-input terminals;

a voltage-generating network including an electronic breakdown device and a constant-current unit in series therewith, said terminals being connected across said breakdown device in an energizing circuit for said detector means;

a source of direct current connected across said network for supplying operating current for said detector means to said energizing circuit via said constant-current unit;

a current-responsive load in series with said source and said constant-current unit;

a voltage-controlled variable-impedance means connected in shunt with at least part of said network across said source in series with said load; and electronic control means coupled to said detector means and connected to said variable-impedance means for altering the conductivity thereof in response to changes in said output signal, thereby modifying the flow of current through said load with maintenance of a sufficient voltage drop across said breakdown device via said constant-current unit to keep said detector means operative regardless of changes in the conductivity of said variable-impedance means.

2. A system as defined in claim 1 wherein said source comprises an alternating-current supply and rectifier means in series therewith for delivering a pulsating direct current to said network and to said variable-impedance means, further comprising a storage capacitor bridged across said terminals in shunt with said breakdown device.

3. A system as defined in claim 2 wherein said energizing circuit includes a series diode inserted between said breakdown device and said storage capacitor.

4. A system as defined in claim 2 wherein said breakdown device comprises a Zener diode.

5. A system as defined in claim 2 wherein said breakdown device comprises a thyristor and a nonlinear impedance, said thyristor having an anode and a cathode respectively connected to said terminals and further having a gate connected to said anode through said nonlinear impedance.

6. A system as defined in claim 5 wherein said nonlinear impedance is a Zener diode.

7. A system as defined in claim 2 wherein said variable-impedance means comprises a binary electronic switch.

8. A system as defined in claim 7 wherein said electronic switch is a thyristor with a cathode lead and a gate lead, one of said leads being connected to a junction of said constant-current unit with said breakdown device, the other of said leads being connected to an output electrode of said electronic control means.

9. A system as defined in claim 8 wherein said electronic control means is a switching transistor, said output electrode being a collector of said switching transistor.

10. A system as defined in claim 9 wherein said one of said leads is said gate lead and the connection thereof to said junction includes a diode, said collector being connected through a resistor to said junction and to said cathode lead.

11. A system as defined in claim 10 wherein said diode is inserted in said energizing circuit between said breakdown device and said storage capacitor.

12. A system as defined in claim 11, further comprising a second diode in cascade with the first-mentioned diode interposed between said cathode lead and said breakdown device.

13. A system as defined in claim 9 wherein said other of said leads in said cathode lead, further comprising biasing means for said gate lead including an inverter stage inserted between said gate lead and said collector.

14. A system as defined in claim 13 wherein said biasing means further includes an ancillary transistor having an emitter connected to said gate lead, a base connected to said inverter stage and a collector connected to said junction.

15. A system as defined in claim 9 wherein said switching transistor is provided with an emitter tied to said energizing circuit and with a shunt circuit across its emitter/collector path including a collector resistor and a Zener diode in series, said gate lead being connected to said junction, said cathode lead being connected to said shunt circuit between said collector resistor and said Zener diode.

16. A system as defined in claim 15 wherein said Zener diode has a breakdown voltage at least equal to the voltage drop across said breakdown device.

17. A system as defined in claim 1 wherein said constant-current unit comprises an output transistor with a collector, an emitter and a base, and a biasing circuit for said base forming a voltage divider connected across said collector and emitter between said breakdown device and said load.

18. A system as defined in claim 17 wherein said voltage divider has a resistive first branch connected between said collector and said base, said biasing circuit further having an at least partly semiconductive second branch inserted between said base and said emitter.

19. A system as defined in claim 18 wherein said second branch comprises a Zener diode.

20. A system as defined in claim 18 wherein said second branch comprises an ancillary transistor, said output transistor being provided with an emitter resistor in an input circuit of said ancillary transistor for controlling the conductivity of the latter to compensate for changes in current flow through said emitter resistor.

21. A system as defined in claim 20, further comprising shunt transistor means with an input connection to a tap on said voltage divider and with an output connection to said emitter.

22. A system as defined in claim 21 wherein said shunt transistor means comprises a pair of complementary transistors in tandem.

23. A system as defined in claim 21, further comprising a damping capacitor bridging said input and output connections.

24. A system as defined in claim 21, further comprising threshold-responsive diode means inserted in a forward direction between said output transistor and said emitter resistor, said output connection terminating at a junction of said diode means with said emitter resistor.

25. A system as defined in claim 17 wherein said output transistor is provided with a protective collector resistor.

* * * * *